US006656805B2

United States Patent
Kamath et al.

(10) Patent No.: US 6,656,805 B2
(45) Date of Patent: Dec. 2, 2003

(54) METHOD OF REDUCING SILICON OXYNITRIDE GATE INSULATOR THICKNESS IN SOME TRANSISTORS OF A HYBRID INTEGRATED CIRCUIT TO OBTAIN INCREASED DIFFERENTIAL IN GATE INSULATOR THICKNESS WITH OTHER TRANSISTORS OF THE HYBRID CIRCUIT

(75) Inventors: Arvind Kamath, Mountain View, CA (US); Rajiv Patel, San Jose, CA (US); Ravindra M. Kapre, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/304,631

(22) Filed: Nov. 26, 2002

(65) Prior Publication Data

US 2003/0077866 A1 Apr. 24, 2003

Related U.S. Application Data

(62) Division of application No. 09/724,225, filed on Nov. 28, 2000.
(51) Int. Cl.$^7$ .............................................. H01L 21/336
(52) U.S. Cl. ...................................................... 438/287
(58) Field of Search ................................. 257/391, 369, 257/392, E27.081, E29.304

(56) References Cited

U.S. PATENT DOCUMENTS

| | | | | | |
|---|---|---|---|---|---|
| 5,330,920 A | * | 7/1994 | Soleimani et al. | .......... | 438/703 |
| 5,532,181 A | * | 7/1996 | Takebuchi et al. | .......... | 438/258 |
| 5,861,347 A | * | 1/1999 | Maiti et al. | .................. | 438/787 |
| 5,920,779 A | * | 7/1999 | Sun et al. | .................... | 438/275 |
| 6,180,543 B1 | * | 1/2001 | Yu et al. | ..................... | 438/787 |
| 6,333,541 B1 | * | 12/2001 | Matsuoka et al. | .......... | 257/391 |

* cited by examiner

Primary Examiner—John F. Niebling
Assistant Examiner—Ron Pompey
(74) Attorney, Agent, or Firm—John R. Ley, LLC

(57) ABSTRACT

A relatively thin gate insulator of a digital switching transistor is formed from a layer of silicon oxynitride which was initially formed by implanting nitrogen atoms in a silicon substrate and oxidizing the nitrogen and silicon. It has been discovered that an outer layer of silicon dioxide is formed as a part of the silicon oxynitride layer. Removing this outer layer of silicon dioxide from the silicon oxynitride layer leaves a thin remaining layer of substantially-only silicon oxynitride as the gate insulator. Thinner gate insulators of approximately 15–21 angstroms, for example, can be formed from a grown thickness of 60 angstroms, for example. Gate insulators for digital and analog transistors may be formed simultaneously with a greater differential in thickness been possible by using conventional nitrogen implantation techniques.

10 Claims, 4 Drawing Sheets

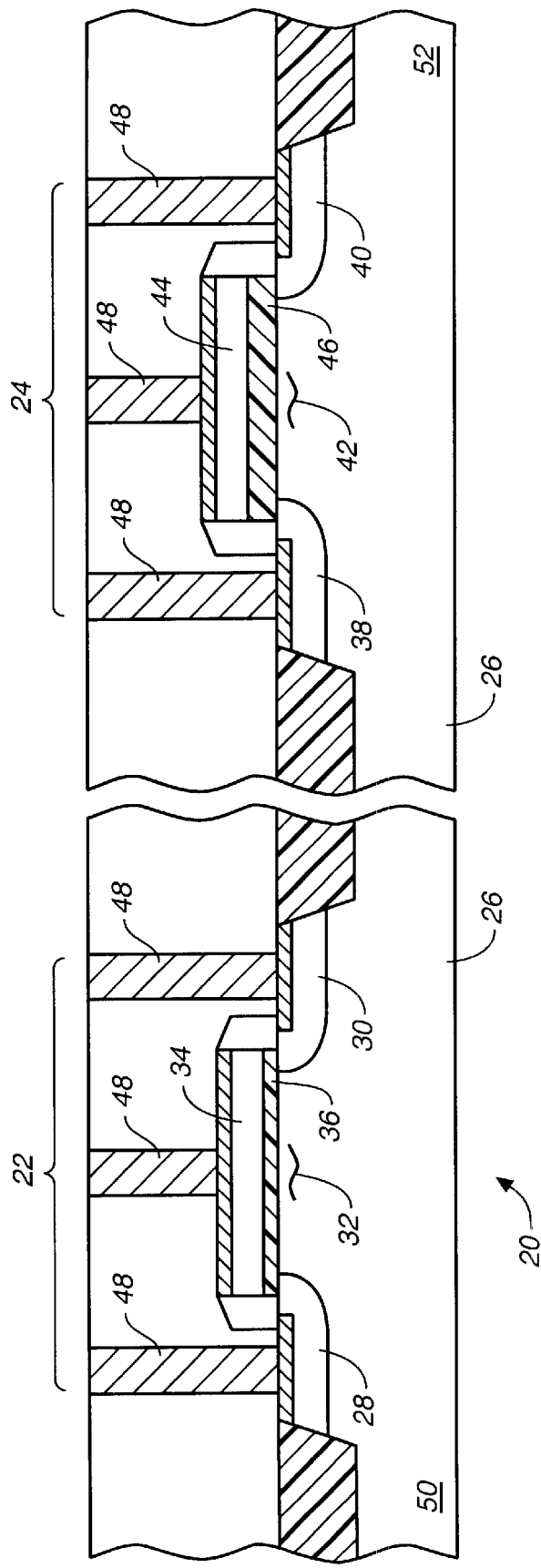
FIG._1

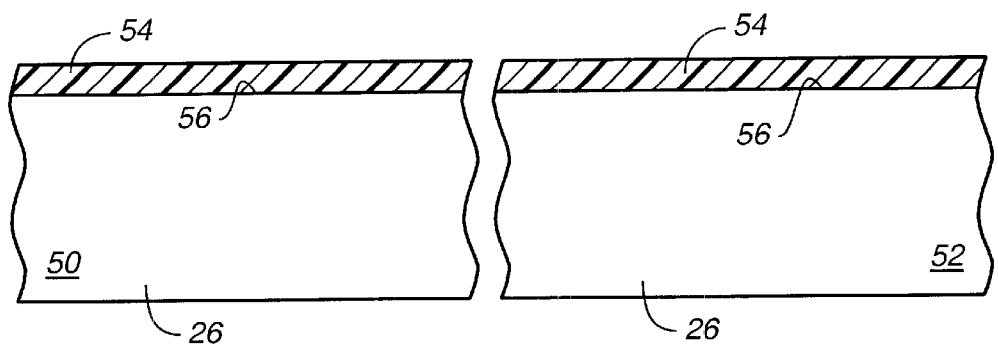
FIG._2
*(PRIOR ART)*
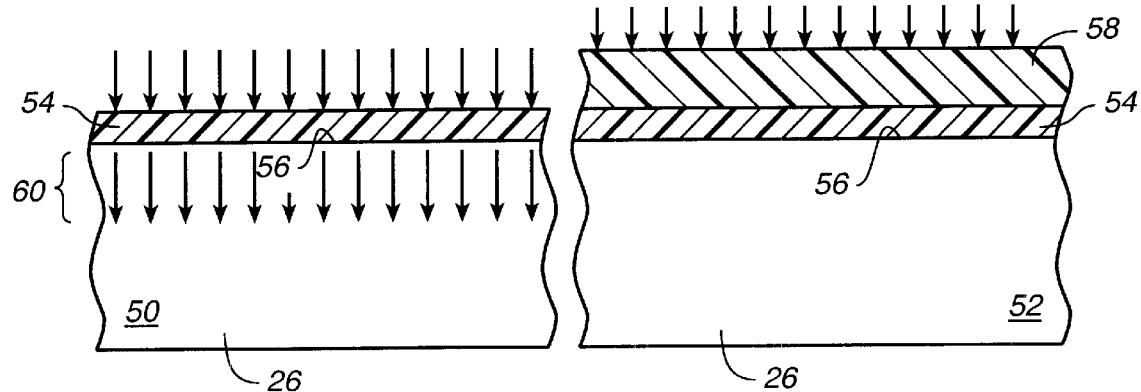
FIG._3
*(PRIOR ART)*
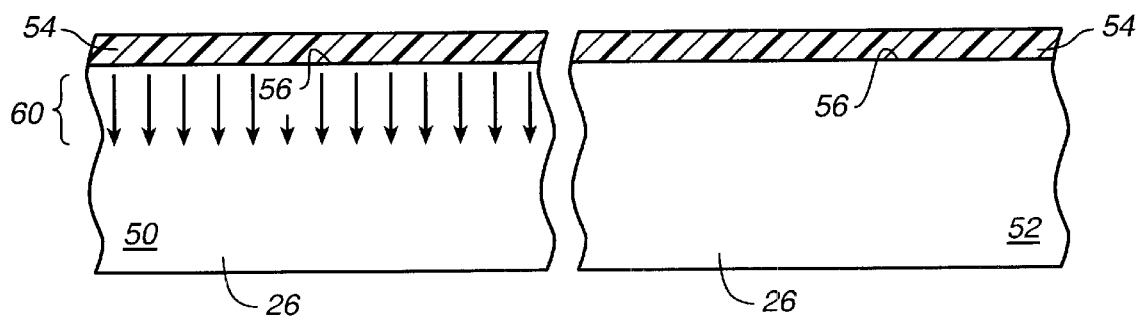
FIG._4
*(PRIOR ART)*

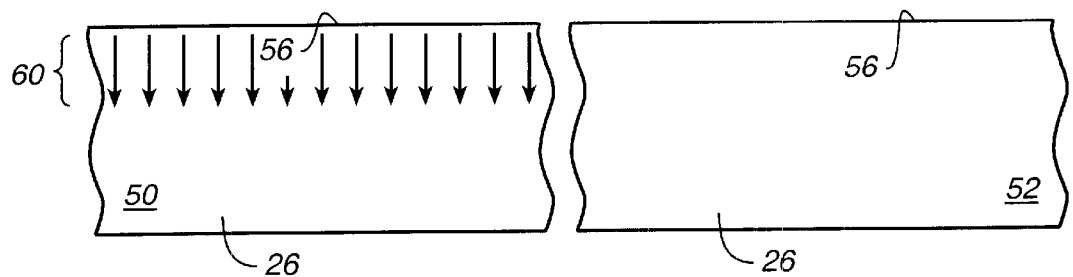
FIG._5
*(PRIOR ART)*
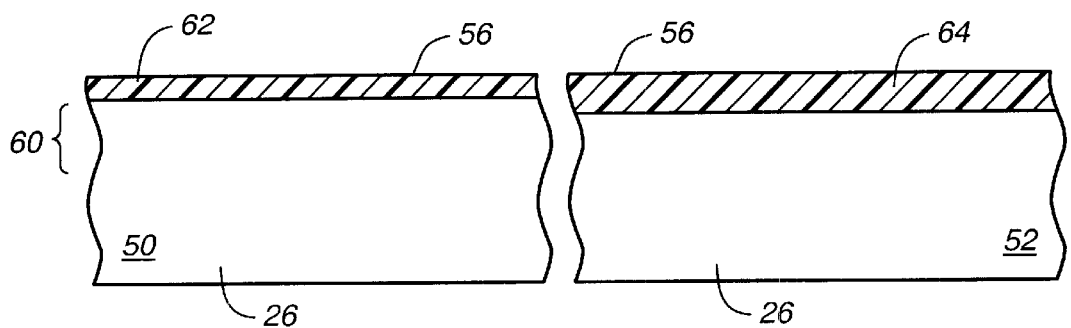
FIG._6
*(PRIOR ART)*
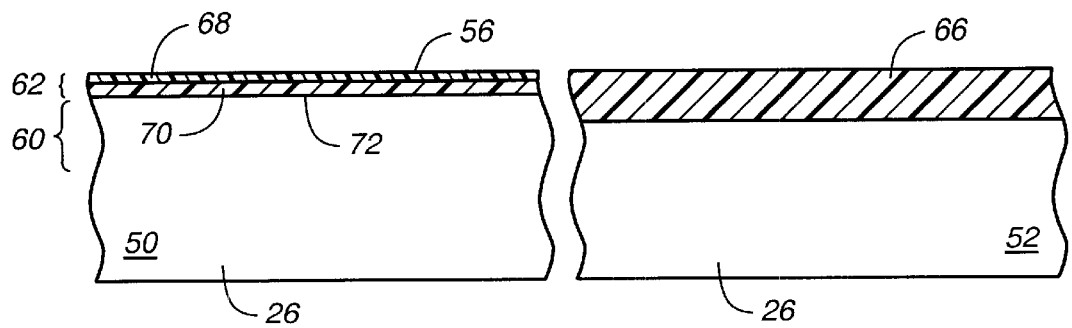
FIG._7

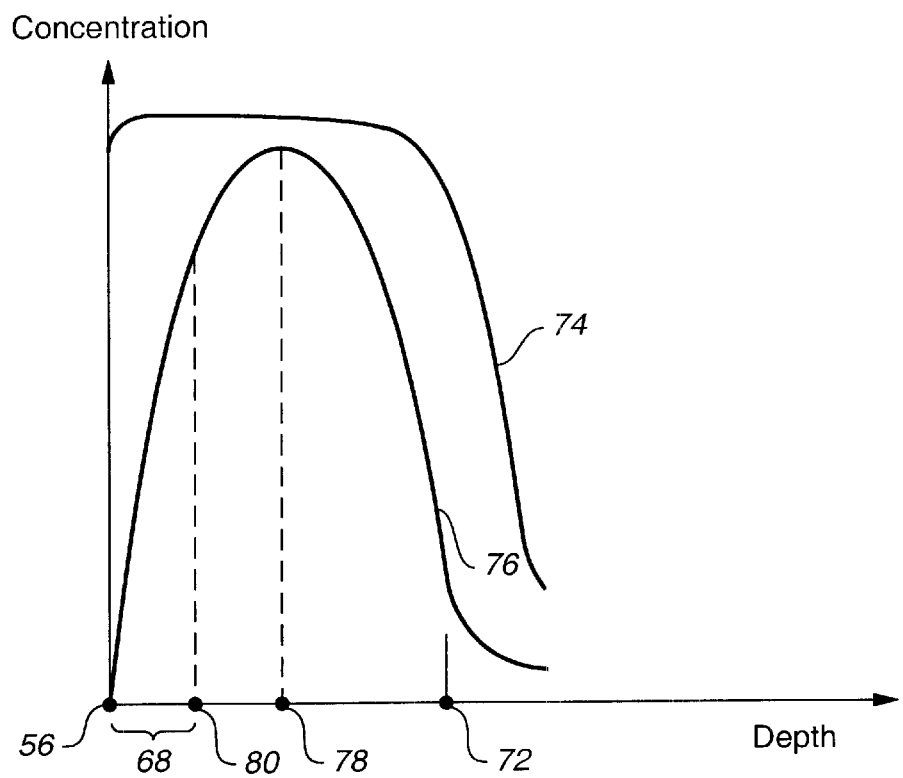
FIG._8
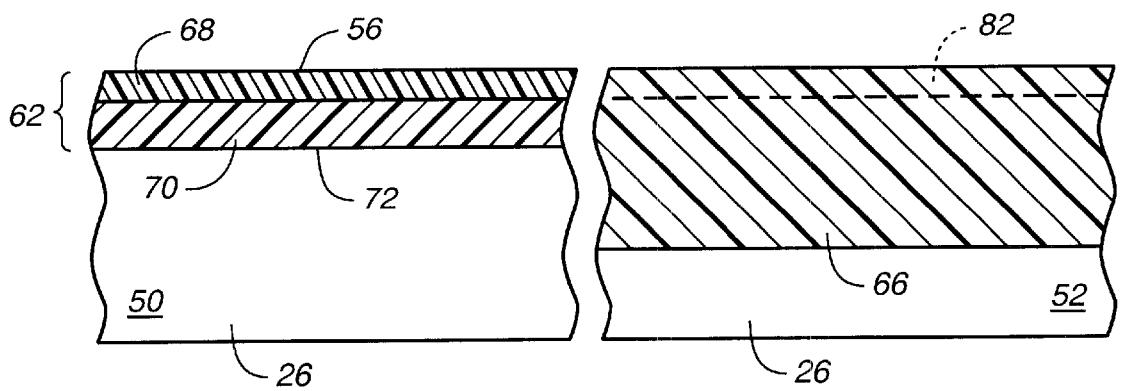
FIG._9

METHOD OF REDUCING SILICON OXYNITRIDE GATE INSULATOR THICKNESS IN SOME TRANSISTORS OF A HYBRID INTEGRATED CIRCUIT TO OBTAIN INCREASED DIFFERENTIAL IN GATE INSULATOR THICKNESS WITH OTHER TRANSISTORS OF THE HYBRID CIRCUIT

CROSS-REFERENCE TO RELATED INVENTIONS

This invention is a division of U.S. application Ser. No. 09/724,225 filed Nov. 28, 2000, filed by the inventors herein.

This invention is related to an invention for Silicon Nitride and Silicon Dioxide Gate Insulator Transistors and Method of Forming Same in a Hybrid Integrated Circuit, described in U.S. Pat. No. 6,436,845, which was filed Nov. 28, 2000, invented by some of the present inventors, and assigned to the assignee of the present invention. The subject matter of this filed application is incorporated herein by this reference.

FIELD OF THE INVENTION

This invention relates to semiconductor integrated circuits (ICs) of the type which incorporate digital or high frequency switching transistors, and ICs of the type in which it is desirable to incorporate transistors on the same substrate which have gate insulators of relatively great differential in thickness, such as digital switching transistors and analog linearly-responsive transistors on a "hybrid" IC. This invention also relates to methods of manufacturing transistors which operate at higher frequencies and to methods of manufacturing hybrid ICs. More particularly, the present invention relates to a new and improved method of fabricating a reduced thickness gate insulator of a high frequency switching transistor, and doing so in a hybrid circuit while the gate insulator of an analog linear transistor is maintained relatively thick. The present invention also relates to a new and improved hybrid IC which has a relatively greater differential in the thickness of the gate insulator of two types of transistors, for example digital switching transistors and analog response transistors. The relatively thinner gate insulator of higher frequency switching capability at low voltage, while the relatively thicker gate insulator maintains a better linear response at high voltage to enhance the analog aspects of the hybrid IC.

BACKGROUND OF THE INVENTION

Recent evolutions of semiconductor IC electronics have combined digital and analog circuitry on the same chip or substrate. Such ICs are known as "systems on a chip," system level integrated circuits (SLICs) or application specific integrated circuits (ASICs). The combination digital and analog circuitry on the same IC is also sometimes referred to as "hybrid" or "mixed signal" technology. Combining digital and analog circuitry on a hybrid IC simplifies the construction of many electrical devices which require both digital and analog signals. A single hybrid IC may be used in place of multiple ICs. Previously, it was typical practice to separate the digital circuitry and the analog circuitry, with each type of circuitry confined to its own separate IC and IC package. It was then necessary to connect the separate ICs together with a printed circuit or other connection. Combining the digital and analog circuitry on the same hybrid IC reduces the cost, complexity and size of the electronic circuitry compared to connecting separate digital and analog circuit ICs.

Digital and analog circuitry have somewhat different functional considerations, and satisfying those considerations simultaneously has imposed significant constraints on the semiconductor fabrication techniques used to manufacture hybrid ICs. Since both the digital and analog circuitry must be fabricated on the same substrate, the analog and digital components must be formed simultaneously when fabricating the single hybrid IC. The semiconductor fabrication techniques and processes used for such hybrid circuits must accommodate and secure the required functional behavior of both the digital and analog circuitry. Since semiconductor fabrication techniques may be oriented to optimize the performance of the digital circuitry or the analog circuitry, but usually not both, it is typical that most hybrid ICs are formed by semiconductor fabrication technology which somewhat compromises both the digital and analog functional characteristics.

One area of compromise relates to the functional requirements of the digital switching transistors and the analog linear transistors. Generally speaking, the digital switching transistors operate at a lower voltage on the hybrid IC, typically in the neighborhood of approximately 1.0–1.5 volts. The lower voltages are used because less power is consumed and because the on/off, conductive/nonconductive characteristics of the digital switching transistors do not require a linear response between their conductive and nonconductive states. Instead, the primary consideration with respect to digital transistors is achieving higher frequency or higher speed switching rates. In contrast, the analog linear transistors require a larger operating voltage, typically in the neighborhood of approximately 2.5–5.0 volts. The higher voltage is required to develop a sufficient magnitude for the analog signals and to provide the analog transistors with enough voltage range to allow them to operate in their linear transconductance or response range.

The differing functional requirements for digital and analog transistors are revealed perhaps most significantly in regard to the thickness of the gate insulator used in each type of transistor. In digital switching transistors, the gate insulator is kept as thin as possible, because the thinner insulator will result in higher frequency switching capability. Also, the lower operating voltages of digital switching transistors require a thinner insulator to maximize driving current. In analog linear transistors, the gate insulator is kept relatively thick, because a relatively thick gate insulator more effectively establishes linear response characteristics with better noise immunity. The higher operating voltages are also better tolerated by a thicker gate insulator, particularly for reliability considerations. However, in hybrid ICs, where the gate insulators of both the digital and analog transistors must be formed simultaneously, it has been particularly challenging to achieve semiconductor fabrication techniques which permit a relatively thinner gate insulator for the digital transistors and a relatively thicker gate insulator for the analog transistors.

Another consideration is that the material structure of the gate insulator for the relatively thinner digital switching transistors must be sufficient to prevent the out-diffusion of boron from a P-type gate when the IC is subjected to relatively high temperatures during the fabrication process. A chemically and modified, pure silicon dioxide thin gate insulator permits the out-diffusing dopant to enter the substrate and shift threshold voltages uncontrollably, thereby destroying or significantly impairing the proper functionality of the digital transistor. Because of the problem of out-diffusion, it is typical to introduce nitrogen in the relatively thinner gate insulator of the digital transistors. One such method is nitrogen implantation in the thin gate area. The implanted nitrogen blocks the out-diffusing boron and prevents the boron from entering the substrate. Although the thinner gate insulator has a tendency to permit more tunneling leakage current between the gate and the channel, the nitrogen in the gate insulator of the digital transistor significantly diminishes the amount of leakage current by increasing the dielectric constant. On the other hand, the relatively thicker gate insulator of the analog transistor generally provides a sufficient barrier to the leakage current, simply as a result of its relatively greater thickness. For these reasons, it is typical that the relatively thinner gate insulator of digital transistors be formed of silicon oxynitride, which results from oxidizing the silicon substrate that has been implanted with sufficient nitrogen.

It is with respect to these and other considerations that the present invention has evolved.

SUMMARY OF THE INVENTION

The present invention involves the use of nitrogen implantation to fabricate digital switching transistors with a relatively thinner silicon oxynitride gate insulator compared to previous silicon oxynitride gate insulators. The present invention also involves fabricating the gate insulator of digital switching transistors from a relatively thinner layer of silicon oxynitride while fabricating the gate insulator of analog linear transistors from a relatively thicker layer silicon dioxide, in a singular semiconductor fabrication process. The invention also involves a gate insulator fabrication technique for hybrid ICs which achieves a greater differential in the relative thicknesses of the gate insulators of the digital transistors and the analog transistors. Another aspect of the present invention involves the exploitation of a discovery relating to the atomic structure of silicon oxynitride gate insulators formed by implanting nitrogen in silicon dioxide, which allows those silicon oxynitride gate insulators to be effectively and easily diminished in thickness. A further aspect of the invention involves the fabrication of higher performance, higher switching frequency digital transistors, either on a digital IC or in combination with analog linear transistors on a hybrid IC.

These and other aspects are accomplished in a method of forming a relatively thin gate insulator of a digital switching transistor from a layer of silicon oxynitride initially formed by implanting nitrogen atoms in a silicon substrate and oxidizing the nitrogen and silicon. The steps of the method include forming an outer layer of silicon dioxide as a part of the silicon oxynitride layer formed by oxidizing the nitrogen and silicon, removing the outer layer of silicon dioxide from the silicon oxynitride layer to leave a remaining layer of substantially only silicon oxynitride, and using the remaining layer of substantially-only silicon oxynitride to form the gate insulator. To the extent that this method is practiced on a hybrid circuit having gate insulators of different thicknesses, a thickness differential is established between the implanted thin region and the un-implanted thick region.

The initially formed layer of silicon oxynitride is, for example, approximately 22–29 angstroms in thickness for a thickness of 60 angstroms of relatively thick oxide, depending on oxidizing ambient conditions. The outer layer of silicon dioxide is approximately 8–12 angstroms in thickness, for example, and the removal of the outer layer forms the substantially-only silicon oxynitride gate insulator layer of approximately 15–21 angstroms in thickness as an optimized final target range. The substantially-only silicon oxynitride gate insulator layer is substantially thinner and results in a higher frequency switching capability as well as a greater differential between the thicknesses of the gate insulators of the digital transistors and the analog linear transistors in a hybrid IC.

To fabricate the digital transistor and the analog transistor on the same substrate of a hybrid IC, a relatively thick gate insulator of the analog transistor is formed by oxidizing the silicon substrate into a relatively thick layer of silicon dioxide. In this method, the relatively thick layer of silicon dioxide is formed to an initial thickness which is greater than the desired final thickness of the gate insulator of the analog transistor, and an upper portion of the relatively thick initial layer of silicon dioxide for the analog transistor gate insulator is removed simultaneously with the outer layer of silicon dioxide from the silicon oxynitride layer which forms the thin gate insulator for the digital transistor. The relatively thick layer of silicon dioxide for the analog transistor gate insulator is formed simultaneously with forming the layer of the silicon oxynitride, and the same amount of the upper portion of the relatively thick initial layer of silicon dioxide for the analog transistor gate insulator is removed simultaneously with the outer layer of silicon dioxide from the silicon oxynitride layer.

Further preferred aspects include applying thermal energy during the oxidizing step, oxidizing an initial layer of silicon dioxide on a surface of the substrate to prevent the implanted nitrogen atoms from out-diffusing from the substrate, converting approximately a lower half of the initial surface layer of silicon dioxide into silicon oxynitride, removing approximately the upper half of the initial surface layer of silicon dioxide, and etching away the layers of silicon dioxide by placing the outer layer of silicon dioxide in a bath of hydrofluoric acid.

Other aspects of the invention relate to a high frequency digital switching transistor formed on the silicon substrate having a gate insulator layer of approximately 15–21 angstroms in exemplary thickness formed of substantially-only silicon oxynitride. The high frequency digital switching transistor may be part of a hybrid integrated circuit which also includes an analog linear transistor formed on the silicon substrate, in which the analog linear transistor has a gate insulator layer of 60 angstroms in exemplary thickness formed of silicon dioxide. The gate insulator layer of the digital transistor is preferably formed by implanting nitrogen atoms into the silicon substrate, oxidizing the nitrogen and silicon to form a layer of the silicon oxynitride, forming an outer layer of silicon dioxide as a part of forming the silicon oxynitride layer, removing the outer layer of silicon dioxide from the silicon oxynitride layer to leave a remaining layer of substantially-only silicon oxynitride, and forming the gate insulator from the remaining layer of substantially-only silicon oxynitride. The gate insulator layer of the analog transistor in a hybrid IC is preferably formed by simultaneously occurring steps such as oxidizing the relatively thick layer of silicon dioxide to form the analog transistor gate insulator while oxidizing the nitrogen and silicon to form a layer of the silicon oxynitride, and removing the upper portion of the relatively thick initial layer of silicon dioxide for the analog transistor gate insulator simultaneously with removing the outer layer of silicon dioxide from the silicon oxynitride layer.

A more complete appreciation of the present invention and its scope, and the manner in which it achieves the above noted improvements, can be obtained by reference to the following detailed description of presently preferred embodiments of the invention taken in connection with the

BRIEF DESCRIPTION OF THE DRAWINGS

FIG. 1 is a simplified, broken, cross-sectional view of a portion of a hybrid integrated circuit in which the present invention is incorporated and which has been fabricated according to the present invention.

FIGS. 2–6 are enlarged, broken, cross-sectional views of portions of the hybrid integrated circuit shown in FIG. 1, which show prior art steps involved in the fabrication of the hybrid integrated circuit shown in FIG. 1, and which are also employed as part of the present invention.

FIG. 7 is an enlarged, broken, cross-sectional view similar to FIG. 6 showing a new aspect of the methodology of the present invention.

FIG. 8 is a graph showing the concentration of oxygen and nitrogen atoms in silicon oxynitride after nitrogen atoms implanted in silicon dioxide have been oxidized into the silicon oxynitride during the formation of a thin gate insulator of a digital switching transistor in accordance with the present invention.

FIG. 9 is an even more enlarged, broken, cross-sectional view of portions of the hybrid integrated circuit shown in FIG. 1, showing new aspects of the methodolgy of the present invention.

DETAILED DESCRIPTION

A portion of a hybrid integrated circuit (IC) 20 which incorporates the present invention and which is formed by the methodology of the present invention is shown in FIG. 1. The IC 20 includes a digital switching transistor structure 22 and an analog linear transistor structure 24, both of which are formed in a common silicon substrate 26 of the IC 20. The digital transistor 22 includes a source region 28 and a drain region 30 which are formed in the substrate 26 and which are separated by a channel 32 which extends in the substrate 26 between the source and drain regions 28 and 30. The digital transistor 22 also includes a gate 34 which is separated by and insulated from the channel 32 by a digital transistor gate insulator region or layer 36. At another location on the IC 20, the analog transistor 24 also includes its own source region 38 and drain region 40 which are also formed in the silicon substrate 26. A channel 42 extends through the substrate 26 between the source and drain regions 38 and 40. A gate 44 of the analog transistor 24 is separated by and insulated from the channel 42 by an analog transistor gate insulator region or layer 46. The transistor structures 22 and 24 are formed in a conventional manner using conventional techniques, except with respect to the digital gate insulator 36 and the analog gate insulator 46. The present invention centers around the fabrication of the gate insulators 36 and 46 for incorporation in either an entirely digital IC (not specifically shown, but represented by the digital transistor 22 of the IC 20), or as incorporated in a hybrid IC such as that illustrated at 20.

Separate power supply voltages are supplied to the digital transistor 22 and to the analog transistor 24, by conventional conductors 48 which connect to the source, drain and gate regions of the transistors 22 and 24. The digital transistor 22 typically operates from a relatively lower power supply voltage, for example 1.0–1.5 volts. The analog transistor 24 utilizes a relatively higher power supply voltage, for example 2.5–5.0 volts. The separate power supply voltages are derived from external sources (not shown), but both different levels of voltage are present in the same IC 20 and with respect to the same substrate 26.

As shown in FIG. 1, the digital gate insulator 36 has considerably less thickness (measured in a vertical dimension) than the thickness of the analog gate insulator 46. A relatively thinner digital gate insulator 36 is desirable because it imparts to the digital transistor 22 the capabilities of a higher frequency switching and greater drive current at low voltage. A relatively high frequency switching capability is a very desirable characteristic of the digital transistor 22, as is known and discussed above. The relatively thicker analog gate insulator 46 is also desirable because it imparts a greater capability to withstand the higher voltages applied to the analog transistor 24 without breaking down, and the relatively thicker analog gate insulator 46 obtains a more linear transconductance and response characteristic from the analog transistor 24. Linear response characteristics are essential for the proper functionality of the analog circuit, as is known and described above.

In conventional prior art hybrid ICs, the digital gate insulator 36 is typically less thick than the analog gate insulator 46. While it is recognized that a thinner digital gate insulator 36 will result in higher frequency switching capabilities in the digital transistor 22, the most minimal thickness which is believed to have previously been obtained for silicon oxynitride digital gate insulators is in the neighborhood of 22–29 angstroms while maintaining a 60 angstroms thick gate insulator on other transistors, depending on oxidizing conditions. On the other hand, it is recognized that a satisfactory thickness of the analog gate insulator 46 should be approximately 60 angstroms. The present invention provides an effective technique for reducing the thickness of the digital gate insulator 36 into approximately the range of 15–21 angstroms, in a preferred embodiment. The reduced thickness of the digital gate insulator 36 achieved by the present invention obtains a significant increase of approximately 8% in the switching frequency of the digital transistor 22, in a preferred embodiment. The reduced thickness of the digital gate insulator obtained from the present invention may be applied to entirely digital ICs or to hybrid ICs. When applied hybrid ICs, the method of forming the relatively thinner digital gate insulator 36 does not reduce or negatively impact the desirable, relatively greater thickness of the analog gate insulator 46, thereby achieving a greater difference in the relative thicknesses of the digital and analog gate insulators for the digital and analog transistors, respectively, on a hybrid IC.

The first step in a method of forming the relatively thinner digital gate insulator in accordance with the present invention is shown in FIG. 2. One area 50 of the silicon substrate 26 is intended for the fabrication of digital switching transistors, and another area 52 of the substrate 26 is intended for the fabrication of analog linear transistors. The single silicon substrate 26 may contain multiple digital transistor areas 50 and analog transistor areas 52 at various different locations, since the digital circuitry and the analog circuitry may be disbursed at multiple locations within the hybrid IC 20 (FIG. 1).

Initially, a relatively thick layer 54 of sacrificial silicon dioxide is formed into an upper surface of the silicon substrate 26. Preferably, the relatively thick layer 54 of silicon dioxide is formed to a depth of approximately 100 angstroms, stopping at an upper, unaffected surface 56 of the silicon substrate 26. The silicon dioxide layer 54 is formed into the substrate 26 using conventional oxidation techniques. The thickness of the silicon dioxide layer 54 is not particularly critical, because as will be seen from the following discussion, the silicon dioxide layer 54 is ultimately stripped from the substrate 26, leaving the surfaces 56 exposed for subsequent process steps at different times in the process.

Next as shown in FIG. 3, a relatively thick mask layer 58 is formed on the silicon dioxide layer 54 above the analog transistor area 52. The mask layer 58 is preferably formed of photoresist material which is deposited and patterned in a conventional manner. The mask layer 58 of photoresist material covers the silicon dioxide layer 54 above analog transistor area 52 but leaves the silicon dioxide layer 54 above the digital transistor area 50 exposed.

Nitrogen atoms are next implanted in the substrate 26, as is shown by arrows in FIG. 3. The nitrogen atoms are implanted into a region 60 of the substrate 26 within the digital transistor area 50. During implantation, the nitrogen atoms pass through the exposed silicon dioxide layer 54 above the digital transistor area 50. The nitrogen atoms are implanted using conventional implantation techniques, with an exemplary implant energy of approximately 1E15 25 keV depending on the target thickness and properties desired. The implanted nitrogen atoms in the region 60 preferably extend to the depth within the substrate 26 of approximately 450–500 angstroms, in this case, below the upper surface 56 depending on the implant energy. The implant energy for the nitrogen atoms is sufficient to cause the nitrogen atoms to pass through the exposed silicon dioxide layer 54 above the digital transistor area 50. However, the thickness of the mask layer 58 prevents nitrogen atoms from penetrating through the mask layer 58. Instead, the nitrogen atoms are trapped in the mask layer 58 and do not pass into the silicon dioxide layer 54 above the analog transistor area 52 or into the substrate 26 in the area 52.

The mask layer 58 is thereafter stripped from the silicon dioxide layer 54 above the analog transistor area 52 by using conventional photoresist removal techniques, as shown in FIG. 4. Thereafter, the layer 54 of silicon dioxide above both the areas 50 and 52 is also removed or stripped from the substrate 26 down to the surface 56 by using conventional silicon dioxide removal techniques, as shown in FIG. 5. After removing the silicon dioxide layer 54, the nitrogen implant region 60 is exposed at the upper surface 56 of the silicon substrate 26.

The next step, shown in FIG. 6, involves forming the gate insulators at the surfaces 56 in the areas 50 and 52 for the digital and analog transistors 22 and 24 (FIG. 1), respectively. The entire semiconductor structure is oxidized in a conventional manner by exposing the upper surface 56 of the substrate 26 to an oxygen-rich environment (with optional use of hydrogen chloride gas) and applying thermal energy to the structure.

The thermal energy applied during oxidation causes the implanted nitrogen atoms to move within the region 60 toward the surface 56 of the substrate 26 to meet the oxygen atoms which are diffusing into the silicon substrate as a result of the oxidation. The thermal energy causes the nitrogen atoms to interact with the oxygen and the silicon of the substrate and form a layer 62 of silicon oxynitride at the surface 56 into the substrate 26 above the digital transistor region 50. The oxidation of the silicon at the surface 56 into the substrate 26 above the analog transistor region 52 forms a layer 64 of conventional silicon dioxide.

The implanted nitrogen atoms from the region 60 slow the oxidation of the silicon substrate into the silicon oxynitride layer 62. However, the growth of the silicon dioxide layer 64 proceeds more rapidly, because the absence of nitrogen atoms in the substrate above the area 52 does not inhibit the oxidation process. Consequently, the more rapid growth of the silicon dioxide layer 64 into the surface 56 of the substrate 26 above the area 52 results in a considerably greater thickness of silicon dioxide in the layer 64 compared to the relatively lesser thickness of the silicon oxynitride in the layer 62. The thickness of the silicon oxynitride layer 62 is controlled by the amount or concentration of nitrogen ions implanted into the region 60. The thickness of the silicon dioxide layer 64 is controlled by stopping the oxidation process when the silicon dioxide layer 64 reaches a desired thickness.

The process described in conjunction with FIGS. 2–6 is essentially conventional and used when forming conventional hybrid ICs. The silicon oxynitride layer 62 becomes the gate insulator 36 for the digital transistors 22 of the IC 20 (FIG. 1) while the silicon dioxide layer 64 becomes the gate insulator 46 for the analog transistors 24. The conventional digital transistors 22 are completed by forming the source region 28 and the drain region 30, and by forming the gate 34 (FIG. 1) above the gate insulator 36. The conventional analog transistors 24 are completed by forming the source region 38 and the drain region 40, and by forming the gate 44 (FIG. 1) above the gate insulator 46. To the extent now known, the prior art techniques have not succeeded in reducing the thickness of the digital gate insulator-silicon oxynitride layer 62 to less than approximately 22–29 angstroms (depending on oxidizing conditions). In that case, it is desired that the layer 64 of silicon dioxide be at least 60 angstroms in thickness.

The methodology of the present invention makes use of the same prior art steps described in conjunction with FIGS. 2–6, with two exceptions. The first exception is that the thickness of the silicon dioxide layer 64 which is formed as described as described in conjunction with FIG. 6 is initially formed to a greater thickness than is desired for the ultimate desired thickness of the gate insulator 46 of the analog transistors 24 (FIG. 1). Thus, as shown in FIG. 7, the new step of the present invention involves the growth or formation of the silicon dioxide layer 66 to a greater thickness than the thickness of the silicon dioxide layer 64 formed in the prior art step (FIG. 6). The greater thickness silicon dioxide layer 66 shown in FIG. 7 is formed by simply continuing the oxidation step discussed in conjunction with FIG. 6 for a longer period of time. Preferably and for the reasons discussed below, the greater thickness silicon dioxide layer 66 should be approximately 8 angstroms greater than the ultimate desired thickness of the analog gate insulator 46 of the analog transistor 24 (FIG. 1). As is discussed below in conjunction with FIG. 9, the method of the present invention involves reducing the thickness of the silicon dioxide layer 66 by approximately 8 angstroms, while simultaneously reducing the thickness of the silicon oxynitride layer 62 which forms the digital gate insulator 36 (FIG. 1) by that same amount.

The second exception to the prior art technique shown in FIG. 6 relates to the application of thermal energy when forming the gate insulators. Initially, the oxidation commences at about 650 degrees Celsius. A thin layer of silicon dioxide initially forms on the surfaces 56 at this temperature. Above the area 52, the initial outer layer of silicon dioxide occurs as part of the formation of the larger silicon dioxide layer 64. Above the area 50, the initial outer layer of silicon dioxide occurs as a result of the oxygen and thermal energy interacting with the silicon substrate as the nitrogen atoms move toward the surface from the implanted region 60 This thin layer of silicon dioxide, which is approximately 18 angstroms thick, is sufficient to trap the nitrogen atoms which have been implanted into the region 60 and to prevent their out-diffusion from the surface 56 above the region 60. After the initial thin layer of silicon dioxide has been formed, the temperature can be increased to approximately 850 degrees Celsius, for example. The silicon dioxide layer 66 formed on the analog transistor area 50 continues to grow as the temperature is increased from 650 degrees Celsius to 850 degrees Celsius. Approximately half of the 18 angstrom thick layer of silicon dioxide formed at the surface 56 above the digital transistor area 50 is then converted into silicon oxynitride during the process of the chemical combination of the implanted nitrogen, the silicon and the oxygen during the oxidation step. The half of the original 18 angstrom thick layer of silicon dioxide which is converted into silicon oxynitride exists at the deeper half of the initial 18 angstrom thickness. Thus, primarily silicon dioxide exists for approximately the first 9 angstroms of depth of the silicon oxynitride layer 62. The existence of this outer silicon dioxide-like layer 68 and the conversion of the inner silicon dioxide-like layer 70 into silicon oxynitride represent significant aspects of the discovery made by the inventors herein, as a part of this invention.

The inventors' discovery which is exploited in the present invention concerns the atomic structure of the layer 62 of silicon oxynitride formed by a nitrogen atom implant. The graph shown in FIG. 8 illustrates the discovery and serves as the basis for understanding how a reduction in the thickness of the silicon oxynitride layer 62 is possible from the present invention. The graph shown in FIG. 8 illustrates the concentration of oxygen and nitrogen atoms within the silicon oxynitride layer 62, after that layer 62 has been formed as described above. The concentration of the oxygen and nitrogen atoms is shown on the vertical axis in the graph of FIG. 8 relative to the depth of the silicon oxynitride layer 62 shown on the horizontal axis. The depth of the silicon oxynitride layer 62 is shown in FIG. 8 as starting at the point of the upper surface 56 and terminating terminating at a lower surface level 72. The point of the lower surface level 72 is the lowest level to which the silicon oxynitride was grown (also see FIG. 7).

The concentration of oxygen atoms within the silicon oxynitride layer 62 is represented by a curve 74, and the concentration of nitrogen atoms within the silicon oxynitride layer 62 is represented by a curve 76. At depths in the substrate 26 below the lower surface level 72 of the silicon oxynitride layer 62, the concentrations of both the oxygen and nitrogen atoms diminish rapidly, thereby indicating that the silicon substrate 26 is not substantially influenced by the oxygen and nitrogen atom concentrations below the lower surface level 72. In general, the depth of the silicon oxynitride layer 62 between the surface 56 and the lower surface level 72 is generally about 29 angstroms.

The curve 74 illustrates that a relatively high concentration of oxygen atoms exists from the surface 56 down through substantially the entire silicon oxynitride layer 62 to its lower surface level 72. The curve 76 illustrates that the concentration of nitrogen atoms is minimal at the surface level 56, but peaks at a depth location 78 which is approximately midway between the surface level 56 and the lower surface level 72 of the silicon oxynitride layer 62. The relatively low concentration of the nitrogen up to the depth location illustrated at 80, compared to the relatively higher concentration of oxygen, causes the substance in the outer layer 68 (FIG. 7) in the silicon oxynitride layer 62 between the surface 56 and the depth location 80 to behave more similarly to a silicon dioxide than silicon oxynitride. Generally speaking, this silicon dioxide-like layer 68 of material will extend approximately 8–9 angstroms below the surface level 56. It is the recognition and discovery of the existence of the layer 68 of silicon dioxide-like material on the upper surface of the silicon oxynitride layer 62 that permits the present invention to advantageously reduce the thickness of the silicon oxynitride layer 62 to form thinner gate insulators for digital switching transistors.

The outer layer 68 of silicon dioxide-like material which exists on top of the silicon oxynitride layer 62 is also shown in FIG. 9. The silicon dioxide-like layer 68 is formed as a consequence of the formation of the silicon oxynitride layer 62, as has been described above. To reduce the thickness of the silicon oxynitride layer 62, the structure shown in FIG. 9 is dipped in hydrofluoric acid. The hydrofluoric acid attacks the outer layer 68 of silicon dioxide-like material and removes that layer 68 from the silicon oxynitride layer 62, leaving a reduced thickness layer 70 of substantially only silicon oxynitride. Because the outer layer 68 has characteristics which are more similar to the silicon dioxide, the hydrofluoric acid readily etches away the layer 68. However, as the nitrogen atom content increases at depths beyond the depth of level 80 (FIG. 8), the increasing nitrogen concentration impedes the etching action of the hydrofluoric acid. The increasing nitrogen concentration functions similarly to an etch stop layer. Thus, once the layer 68 has been etched away, further etching is significantly impeded by the higher concentration of nitrogen atoms in the larger 70 which is substantially only silicon oxynitride.

On the other hand, the silicon dioxide layer 66 is simultaneously etched by the hydrofluoric acid. The rate of removal of the silicon dioxide layer 66 is approximately equal to the rate of removal of the silicon dioxide-like layer 68. Thus, the hydrofluoric acid dip step shown by FIG. 9 simultaneously removes the layer 68 and a layer 82 from the silicon dioxide layer 66. Even though the higher nitrogen content of the silicon oxynitride layer 72 will stop the hydrofluoric acid from significantly etching material beyond the depth of the silicon dioxide-like layer 68, the silicon dioxide layer 66 will continue to etch. Therefore, it is desirable to time the application of the hydrofluoric acid etching so that the structure is removed from the hydrofluoric acid dip at approximately the time when the silicon dioxide-like layer 68 has been removed from the silicon oxynitride layer 62. Under such circumstances, the layers 68 and 82 will be removed in approximately equal thicknesses. Because the silicon-like dioxide layer 68 will be approximately 8–9 angstroms thick, the layer 66 of silicon oxide should be made initially approximately 8–9 angstroms thicker than the desired thickness of the analog gate insulator 46 (FIG. 1), so that the removal of the 8–9 angstroms of material at layers 68 and 80 will result in a relatively thin (approximately 21 angstroms) gate insulator 36 for the digital switching transistor 22 and a relatively thick (approximately 60 angstroms) gate insulator 46 for the analog transistor 24 (FIG. 1).

The reduced thickness layer 70 of silicon oxynitride becomes the thinner gate insulator 36 for the digital transistor 22. Because the thinner silicon oxynitride layer 70 contains the essential silicon oxynitride characteristics, it functions adequately as a gate insulator while its relative thinness obtains higher frequency switching characteristics of the digital transistor. The silicon dioxide layer 66 is intentionally grown to a greater thickness than is ultimately desired for the analog gate insulator, so the full desired thickness for the analog gate insulator may still be obtained even though the layer 82 (FIG. 9) is removed.

Although the depth 80 has been described in conjunction with FIG. 8 as being approximately 8–9 angstroms below the surface 56 of the silicon oxynitride layer 62, the level of this depth 80 may vary a few angstroms from the described level depending upon the amount of nitrogen implanted and the interaction between the nitrogen, oxygen and silicon in forming the silicon oxynitride layer 62. In practice, the depth 80 may range from approximately 8–12 angstroms from the surface 56, thus causing the relatively thin layer 68 of silicon dioxide-like material to have a thickness of approximately 8–12 angstroms. Since the thickness of the silicon oxynitride layer 62 will generally be approximately 22–29 angstroms, the resulting thickness of the diminished thickness silicon oxynitride layer 70 may be in the range of 15–21 angstroms (29 minus 8–12). Adding hydrochloric acid to the oxidation ambient reduces this differential.

The steps of the present invention to reduce the thickness of the digital gate insulator are believed to be applicable only once. The formation of the silicon oxynitride layer 62 results in fixing the concentration of the nitrogen at the depths illustrated in FIG. 8. This concentration vs. depth profile cannot be changed once it has been fixed by the process of forming the silicon oxynitride layer 62. Removing the silicon dioxide-like layer 68 once leaves no such additional, comparable layer available for removal by a separate, second application of the present invention.

It is apparent from the previous description that the present invention permits the fabrication of digital switching transistors with a relatively thinner silicon oxynitride gate insulator. The thinnest previously known silicon oxynitride gate insulator formed by implanting nitrogen has been, for example, approximately 22–29 angstroms while maintaining a 60 angstrom thickness of the other gate insulator. The present invention teaches a technique for reducing that thickness to approximately 17–21 angstroms, without compromising or reducing the effect of the diminished-thickness silicon oxynitride digital gate insulator. The digital gate insulator formed by this method has also been observed to increase the drive current of digital transistors by approximately 8% compared to those formed from other nitridation techniques. The reduced thickness digital gate insulator may be achieved for digital switching transistors in purely digital ICs, or the technique described above is equally applicable to the fabrication of hybrid ICs. When fabricating hybrid ICs, the technique of the present invention permits the maintenance of the desired greater thickness of the gate insulator of analog linear transistors, thereby making the invention equally applicable to hybrid ICs as to purely digital ICs. A greater differential in the relative thicknesses of the gate insulators of the digital transistors and the analog transistors on a single hybrid IC is also possible as a result of the present invention. Many other advantages and improvements will be apparent after gaining a complete appreciation of the present invention.

Presently preferred embodiments of the present invention and many of its improvements have been described with a degree of particularity. This description is of preferred examples of implementing the invention, and is not necessarily intended to limit the scope of the invention. The scope of the invention is defined by the following claims.

The invention claimed is:

1. A high frequency digital switching transistor formed on a silicon substrate comprising a gate insulator layer of approximately 17–21 angstroms in thickness of substantially only silicon oxynitride remaining after removal of an overlying layer of silicon dioxide formed in the silicon substrate during the formation of the gate insulator layer.

2. A high frequency digital switching transistor as defined in claim 1 which is part of a hybrid integrated circuit which also includes an analog linear transistor formed on the silicon substrate, the analog linear transistor having a gate insulator layer of at least 60 angstroms in thickness which is formed of silicon dioxide.

3. A high frequency digital switching transistor as defined in claim 2 wherein:

the silicon dioxide of the gate insulator layer of the analog linear transistor and the overlying layer of silicon dioxide removed to form the gate insulator layer of the high frequency digital switching transistor both result from the simultaneous formation of the silicon dioxide.

4. A high frequency digital switching transistor as defined in claim 1 wherein:

the overlying layer of silicon dioxide removed to form the gate insulator layer results from implanted atoms of nitrogen which have been oxidized with the silicon of the substrate.

5. A high frequency digital switching transistor as defined in claim 4 which is part of a hybrid integrated circuit that also includes an analog linear transistor which is formed on the silicon substrate and which has a gate insulator which is formed concurrently with components of the gate insulator of the digital transistor.

6. A high frequency digital switching transistor as defined in claim 5 further comprising:

a relatively thick layer of silicon dioxide oxidized into the silicon substrate from which the gate insulator layer of the analog transistor and the gate insulator layer of the digital switching transistor are formed.

7. A high frequency digital switching transistor as defined in claim 6 wherein:

the relatively thick layer of silicon dioxide from which the gate insulator layers of the analog and digital switching transistors are formed results from a singular formation of the relatively thick layer of silicon dioxide.

8. A high frequency digital switching transistor as defined in claim 6 wherein:

the relatively thick layer of silicon dioxide from which the gate insulator layers of the analog and digital switching transistors are formed results from simultaneously forming the portions of the relatively thick layer of silicon dioxide from which the gate insulator layers are formed.

9. A high frequency digital switching transistor as defined in claim 6 wherein:

the gate insulator layer of the analog transistor and the gate insulator layer of the digital transistor result from the removal of outer amounts of the relatively thick layer of silicon dioxide.

10. A high frequency digital switching transistor as defined in claim 6 wherein:

the gate insulator layer of the analog transistor and the gate insulator layer of the digital transistor result from the simultaneous removal of outer amounts of the relatively thick layer of silicon dioxide.

* * * * *